United States Patent
Mazure et al.

(10) Patent No.: US 8,575,697 B2
(45) Date of Patent: Nov. 5, 2013

(54) SRAM-TYPE MEMORY CELL

(75) Inventors: Carlos Mazure, Bernin (FR); Richard Ferrant, Esquibien (FR); Bich-Yen Nguyen, Austin, TX (US)

(73) Assignee: Soitec, Bernin (FR)

( * ) Notice: Subject to any disclaimer, the term of this patent is extended or adjusted under 35 U.S.C. 154(b) by 380 days.

(21) Appl. No.: 13/039,167

(22) Filed: Mar. 2, 2011

(65) Prior Publication Data
US 2011/0233675 A1 Sep. 29, 2011

(30) Foreign Application Priority Data
Mar. 8, 2010 (FR) .................................. 10 51652

(51) Int. Cl.
*H01L 27/11* (2006.01)
*H01L 27/12* (2006.01)
*G11C 5/06* (2006.01)
*G11C 11/00* (2006.01)

(52) U.S. Cl.
USPC .............. 257/347; 257/369; 257/E27.098; 257/E27.112; 257/E21.661; 365/154; 365/156; 365/72

(58) Field of Classification Search
USPC .......... 257/206, 347, 369, E27.112, E27.098, 257/E21.661; 365/72, 154, 156, 174, 205
See application file for complete search history.

(56) References Cited

U.S. PATENT DOCUMENTS

| | | | |
|---|---|---|---|
| 4,169,233 A | 9/1979 | Haraszti | 307/355 |
| 5,028,810 A | 7/1991 | Castro et al. | 307/201 |
| 5,306,530 A | 4/1994 | Strongin et al. | 427/533 |
| 5,325,054 A | 6/1994 | Houston | 324/158 |
| 5,455,791 A | 10/1995 | Zaleski et al. | 365/185.26 |
| 5,557,231 A | 9/1996 | Yamaguchi et al. | 327/534 |
| 5,608,223 A | 3/1997 | Hirokawa et al. | 250/447.11 |
| 5,646,900 A | 7/1997 | Tsukude et al. | 365/205 |
| 5,753,923 A | 5/1998 | Mera et al. | 250/443.1 |
| 5,844,845 A | 12/1998 | Tahara | 365/189.05 |
| 5,869,872 A | 2/1999 | Asai et al. | 257/360 |

(Continued)

FOREIGN PATENT DOCUMENTS

| | | |
|---|---|---|
| EP | 1 081 748 A2 | 3/2001 |
| EP | 1 095 407 A1 | 5/2001 |

(Continued)

OTHER PUBLICATIONS

U.S. Appl. No. 12/793,553, filed Jun. 3, 2010.

(Continued)

*Primary Examiner* — Allison P Bernstein
(74) *Attorney, Agent, or Firm* — Winston & Strawn LLP

(57) ABSTRACT

An SRAM-type memory cell that includes a semiconductor on insulator substrate having a thin film of semiconductor material separated from a base substrate by an insulating layer; and six transistors such as two access transistors, two conduction transistors and two charge transistors arranged so as to form with the conduction transistors two back-coupled inverters. Each of the transistors has a back control gate formed in the base substrate below the channel and able to be biased in order to modulate the threshold voltage of the transistor, with a first back gate line connecting the back control gates of the access transistors to a first potential and a second back gate line connecting the back control gates of the conduction transistors and charge transistors to a second potential. The first and second potentials can be modulated according to the type of cell control operation.

12 Claims, 4 Drawing Sheets

(56) References Cited

U.S. PATENT DOCUMENTS

| | | | |
|---|---|---|---|
| 5,889,293 A | 3/1999 | Rutten et al. | 257/74 |
| 6,043,536 A | 3/2000 | Numata et al. | 257/347 |
| 6,063,686 A | 5/2000 | Masuda et al. | 438/406 |
| 6,072,217 A | 6/2000 | Burr | 257/351 |
| 6,108,264 A | 8/2000 | Takahashi et al. | 365/230.03 |
| 6,141,269 A | 10/2000 | Shiomi et al. | 365/200 |
| 6,300,218 B1 | 10/2001 | Cohen et al. | 438/423 |
| 6,372,600 B1 | 4/2002 | Desko et al. | 438/406 |
| 6,476,462 B2 | 11/2002 | Shimizu et al. | 257/627 |
| 6,498,057 B1 | 12/2002 | Christensen et al. | 438/149 |
| 6,573,549 B1* | 6/2003 | Deng et al. | 257/296 |
| 6,611,023 B1 | 8/2003 | En et al. | 257/350 |
| 6,825,524 B1 | 11/2004 | Ikehashi et al. | 257/314 |
| 6,919,647 B2* | 7/2005 | Hackler et al. | 257/250 |
| 7,109,532 B1 | 9/2006 | Lee et al. | 257/133 |
| 7,112,997 B1 | 9/2006 | Liang et al. | 326/81 |
| 7,400,525 B1* | 7/2008 | Kim | 365/156 |
| 7,447,104 B2 | 11/2008 | Leung | 365/230.06 |
| 7,449,922 B1 | 11/2008 | Ricavy | 327/57 |
| 7,522,445 B2* | 4/2009 | Inaba | 365/154 |
| 7,952,913 B2* | 5/2011 | Hanafi | 365/156 |
| 2001/0038299 A1 | 11/2001 | Afghahi et al. | 326/86 |
| 2001/0047506 A1 | 11/2001 | Houston | 716/4 |
| 2002/0105277 A1 | 8/2002 | Tomita et al. | 315/111.81 |
| 2002/0114191 A1 | 8/2002 | Iwata et al. | 365/185.23 |
| 2002/0185684 A1 | 12/2002 | Campbell et al. | 257/347 |
| 2003/0001658 A1 | 1/2003 | Matsumoto | 327/534 |
| 2004/0108532 A1 | 6/2004 | Forbes | 257/296 |
| 2004/0146701 A1 | 7/2004 | Taguchi | 428/209 |
| 2004/0197970 A1 | 10/2004 | Komatsu | 438/163 |
| 2005/0077566 A1 | 4/2005 | Zheng et al. | 257/315 |
| 2005/0110078 A1 | 5/2005 | Shino | 257/331 |
| 2005/0255666 A1 | 11/2005 | Yang | 438/401 |
| 2005/0276094 A1 | 12/2005 | Yamaoka et al. | 365/154 |
| 2006/0013028 A1 | 1/2006 | Sarin et al. | 365/49 |
| 2006/0013042 A1 | 1/2006 | Forbes et al. | 365/185.08 |
| 2006/0035450 A1 | 2/2006 | Frank et al. | 438/585 |
| 2006/0220085 A1 | 10/2006 | Huo et al. | 257/296 |
| 2006/0226463 A1 | 10/2006 | Forbes | 257/301 |
| 2006/0267064 A1 | 11/2006 | Rosner et al. | 257/304 |
| 2006/0291321 A1 | 12/2006 | Leung | 365/230.06 |
| 2007/0029596 A1 | 2/2007 | Hazama | 257/296 |
| 2007/0029620 A1 | 2/2007 | Nowak | 257/369 |
| 2007/0063284 A1 | 3/2007 | Kawahara et al. | 257/351 |
| 2007/0075366 A1 | 4/2007 | Hamamoto | 257/347 |
| 2007/0076467 A1 | 4/2007 | Yamaoka et al. | 365/154 |
| 2007/0139072 A1 | 6/2007 | Yamaoka et al. | 326/33 |
| 2007/0152736 A1 | 7/2007 | Itoh et al. | 327/534 |
| 2007/0158583 A1 | 7/2007 | Cho | 250/440.11 |
| 2007/0171748 A1 | 7/2007 | Mukhopadhyay et al. | 365/204 |
| 2007/0241388 A1 | 10/2007 | Yamamoto et al. | 257/314 |
| 2007/0298549 A1 | 12/2007 | Jurczak et al. | 438/149 |
| 2008/0042187 A1 | 2/2008 | Hwang | 257/316 |
| 2008/0111199 A1 | 5/2008 | Kim et al. | 257/401 |
| 2008/0116939 A1 | 5/2008 | Takizawa | 326/103 |
| 2008/0144365 A1 | 6/2008 | Yamaoka et al. | 365/181 |
| 2008/0173916 A1 | 7/2008 | Nishihara | 257/298 |
| 2008/0203403 A1 | 8/2008 | Kawahara et al. | 257/80 |
| 2008/0251848 A1 | 10/2008 | Borot et al. | 257/365 |
| 2008/0253159 A1 | 10/2008 | Kajigaya | 365/51 |
| 2009/0003105 A1 | 1/2009 | Itoh et al. | 365/203 |
| 2009/0010056 A1 | 1/2009 | Kuo et al. | 365/184 |
| 2009/0086535 A1 | 4/2009 | Ferrant et al. | 365/174 |
| 2009/0096011 A1 | 4/2009 | Hong et al. | 257/321 |
| 2009/0096036 A1 | 4/2009 | Ishigaki et al. | 257/392 |
| 2009/0101940 A1 | 4/2009 | Barrows et al. | 257/204 |
| 2009/0111223 A1 | 4/2009 | Wiatr et al. | 438/155 |
| 2009/0121269 A1 | 5/2009 | Caillat et al. | 257/301 |
| 2009/0310431 A1 | 12/2009 | Saito | 365/207 |
| 2010/0032761 A1 | 2/2010 | Ding et al. | 257/350 |
| 2010/0035390 A1 | 2/2010 | Ding et al. | 438/152 |
| 2010/0079169 A1 | 4/2010 | Kim et al. | 326/120 |
| 2010/0117684 A1 | 5/2010 | Kim et al. | 326/120 |
| 2011/0024844 A1* | 2/2011 | Ouchi | 257/368 |

FOREIGN PATENT DOCUMENTS

| | | |
|---|---|---|
| EP | 1 199 745 A2 | 4/2002 |
| EP | 1 233 454 A2 | 8/2002 |
| EP | 1 357 603 A2 | 10/2003 |
| EP | 1 744 364 A2 | 1/2007 |
| FR | 2 925 223 | 6/2009 |
| JP | 04345064 A | 12/1992 |
| JP | 08255846 | 10/1996 |
| JP | 09232446 | 9/1997 |
| JP | 10125064 A | 5/1998 |
| JP | 2000196089 A | 7/2000 |
| JP | 2004303499 | 10/2004 |
| WO | WO 99/66559 | 12/1999 |
| WO | WO 2007/060145 A1 | 5/2007 |
| WO | WO 2008/134688 A1 | 11/2008 |
| WO | WO 2009/013422 A2 | 1/2009 |
| WO | WO 2009/028065 A1 | 3/2009 |
| WO | WO 2009/077538 A2 | 6/2009 |
| WO | WO 2009/085865 A1 | 7/2009 |
| WO | WO 2009/104060 A1 | 8/2009 |
| WO | WO 2010/007478 A1 | 1/2010 |

OTHER PUBLICATIONS

U.S. Appl. No. 12/793,515, filed Jun. 3, 2010.
U.S. Appl. No. 12/789,100, filed May 27, 2010.
U.S. Appl. No. 12/886,421, filed Sep. 20, 2010.
U.S. Appl. No. 12/942,754, filed Nov. 9, 2010.
U.S. Appl. No. 12/961,293, filed Dec. 6, 2010.
U.S. Appl. No. 12/984,466, filed Jan. 4, 2011.
U.S. Appl. No. 13/007,483, filed Jan. 14, 2011.
U.S. Appl. No. 13/013,580, filed Feb. 25, 2011.
European Search Report Application No. EP 10 29 0181.6 dated Jan. 14, 2011.
European Search Report Application No. EP 10 29 0217 dated Sep. 15, 2010.
John Barth et al., "A 500MHz Random Cycle 1.5ns-Latency, SOI Embedded DRAM Macro Featuring a 3T Micro Sense Amplifier", ISSCC 2007/Session 27/DRAM and eRAM /27.1, IEEE International Solid-State Circuits Conference, Digest of Technical Papers, pp. 486-487 and p. 617 (2007).
John Barth et al., "A 45nm SOI Embedded DRAM Macro for POWER7™ 32MB On-Chip L3 Cache", ISSCC 2010/Session 19/High-Performance Embedded Memory/19.1, IEEE International Solid-State Circuits Conference, Digest of Technical Papers, pp. 342-344 (2010).
Paul Beckett, XP-002579039, "Performance Characteristics of a Nanoscale Double-gate Reconfigurable Array", Proc. of SPIE, vol. 7268, pp. 72680E-1-72680E-12 (2008).
I. Hassoune et al. "Double-gate MOSFET Based Reconfigurable Cells", The Institution of Engineering and Technology, Electronics Letters, vol. 43, No. 23, 3 pages (2007).
K. Cheng, et al., "Extremely Thin SOI (ETSOI) CMOS with Record Low Variability for Low Power System-on-Chip Applications", IBM Research at Albany Nanotech, pp. 3.2.1-3.2.4( 2009).
P.J. Klim et al, "A 1 MB Cache Subsystem Prototype With 1.8 ns Embedded DRAMs in 45 nm SOI CMOS", IEEE of Solid-State Circuits, vol. 44, No. 4, pp. 1216-1226 (2009).
K. J. Kuhn, "Variation in 45nm and Implications for 32nm and Beyond", Intel, 2009 $2^{nd}$ International CMOS Variability Conference—London, pp. 1-86.
Choi Hoon, et al., XP-002579041, Improved Current Drivability With Back-Gate Bias for Elevated Source and Drain Structured FD-SOI SiGe MOSFET, Microelectronic Engineering, vol. 86, pp. 2165-2169 (2009).
D.E. Ioannou, et al. "Opposite-Channel-Based Injection of Hot-Carriers in SOI MOSFET's: Physics and Applications" IEEE Transactions on Electron Devices, vol. 45, No. 5, pp. 1147-1154 (1998).
K. Itoh, et al., "Impact of FD-SOI on Deep-Sub-100-nm CMOS LSIs—A View of Memory Designers" Central Research Laboratory, Tokyo, Japan, 2 pages, (2006).
K. Roy et al., "Double-Gate SOI Devices for Low-Power and High-Performance Applications", IEEE Computer Society, The British Library, IEEE Xplore, 8 pages, (2006).

(56) References Cited

OTHER PUBLICATIONS

M. Mizukami, et al., "Depletion-type Cell-Transistor of 23 nm Cell Size on Partial SOI Substrate for NAND Flash Memory," Extended Abstracts of the 2009 International Conference on Solid State Devices and Materials, Sendai, pp. 865-866 (2009).

M. Matsumiya, et al., "A 15-ns 16-Mb CMOS SRAM With Interdigitated Bit-Line Architecture," IEEE Journal of Solid-State Circuits, vol. 27, No. 11, pp. 1497-1503 (1992).

S. Mukhopadhyay, et al., "A Novel High-Performance and Robust Sense Amplifier Using Independent Gate Control in Sub-50-nm Double-Gate MOSFET," IEEE Transactions on Very Large Scale Integration (VLSI) Systems, vol. 14, No. 2, pp. 183-192 (2006).

S. Mukhopadhyay, et al., "Design of High Performance Sense Amplifier Using Independent Gate Control in Sub-50nm Double-Gate MOSFET," Computer Society, Proceedings of the Sixth International Symposium on Quality Electronic Design (ISQED'05), The British Library, IEEE Xplore, 6 pages, (2010).

P. Nasalski, et al. "An Innovative sub-32nm SRAM Voltage Sense Amplifier in Double-Gate CMOS Insensitive to Process Variations and Transistor Mismatch" The 15$^{th}$ IEEE International Conference on Electronics, Circuits and Systems, pp. 554-557, (ICECS 2008).

P. Nasalski, et al. "SRAM Voltage and Current Sense Amplifiers in sub-32nm Double-Gate CMOS Insensitive to Process Variations and Transistor Mismatch" IEEE, The British Library, IEEE Xplore, pp. 3170-3173 (2009).

T. Ohtou, et al. "Threshold-Voltage Control of AC Performance Degradation-Free FD SOI MOSFET With Extremely Thin BOX Using Variable Body-Factor Scheme", IEEE Transactions on Electron Devices, vol. 54, No. 2, pp. 301-307, ( 2007).

R. Tsuchiya, et al., "Silicon on Thin BOX: A New Paradigm of the CMOSFET for Low-Power and High-Performance Application Featuring Wide-Range Back-Bias Control" 2004 IEEE, 4 pages.

R. Tsuchiya, et al., "Controllable Inverter Delay and Suppressing $V_{th}$ Fluctuation Technology in Silicon on Thin BOX Featuring Dual Back-Gate Bias Architecture," Central Research Laboratory, Tokyo, Japan, IEEE, pp. 475-478 (2007).

Wilhelmus A. M. Van Noije, et al., XP-002579040, "Advanced CMOS Gate Array Architecture Combining "Gate Isolation" and Programmable Routing Channels," IEEE Journal of Solid-State Circuits, Special Papers, vol. SC-20, No. 2, pp. 469-480 (1985).

M. Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, pp. 2366-2372 (2006).

U.S. Appl. No. 12/880,806, filed Sep. 13, 2010.
U.S. Appl. No. 12/898,230, filed Oct. 5, 2010.
U.S. Appl. No. 12/946,135, filed Nov. 15, 2010.
U.S. Appl. No. 12/974,916, filed Dec. 21, 2010.
U.S. Appl. No. 12/974,822, filed Dec. 21, 2010.

European Search Report Application No. EP 09290838.3 dated Feb. 16, 2010.

M. Yamaoka, et al., "Dynamic-Vt Dual-Power-Supply SRAM Cell using D2G-SOI for Low-Power SoC Application," IEEE International SOI conference, Oct. 2004, pp. 109-111 (2004).

Ulicki, Bob et al., "De-Myth-tifying" the SOI Floating Body Effect, SOI Industry Consortium, pp. 2-7 (2009).

\* cited by examiner

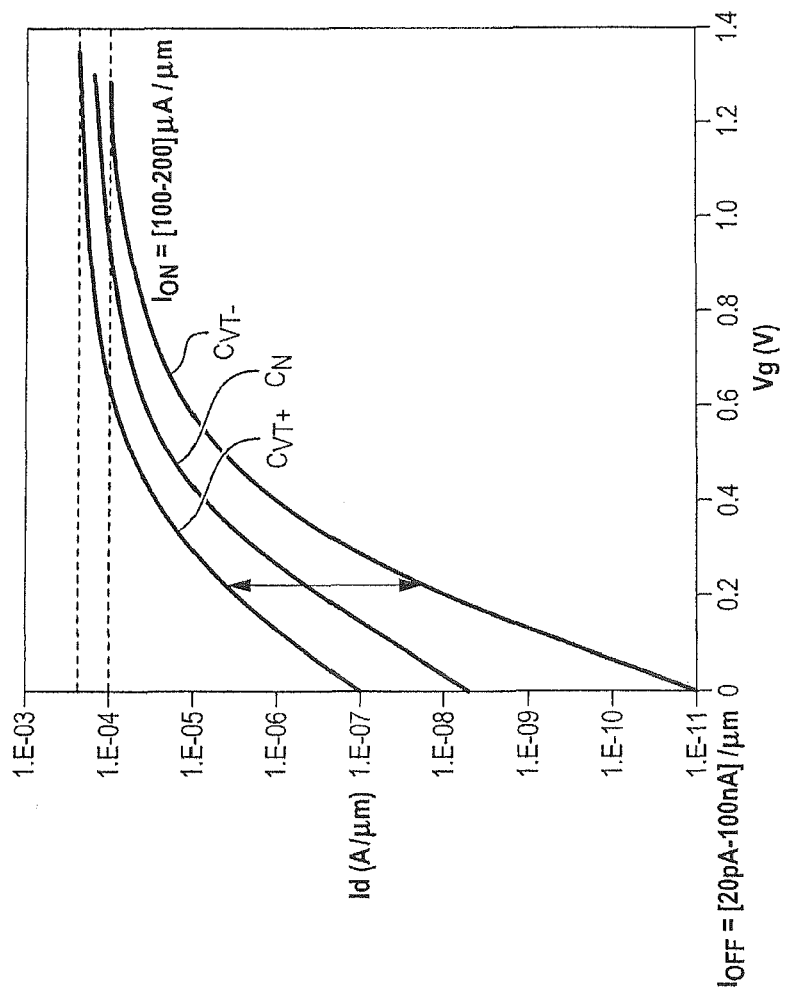

SRAM-TYPE MEMORY CELL

FIELD OF THE INVENTION

The present invention relates to an SRAM-type memory cell formed on a semiconductor on insulator substrate and comprising six transistors.

BACKGROUND OF THE INVENTION

SRAM ("Static Random Access Memory") type memory cells are static ram memories, that is to say memories that do not require periodic refreshing.

Such memory cells are constructed from a set of transistors.

A general concern in this field is how to reduce the size of the cells and how to reduce the leakage currents.

When an SRAM cell is fabricated on a bulk substrate, the size reduction results in a greater variability, which means that the dimensions of the transistors must not be reduced too much, and the read and write components must be separated in order to find an operating point.

This may entail increasing the number of transistors (thus increasing from 6 to 8, or even 10 transistors), with an attendant penalty in terms of surface area.

Moreover, on a "bulk" type substrate, the transistors have different dimensions, depending on their function within the cell (transfer, charge, conduction).

Authors have proposed using FD-SOI type transistors (an acronym standing for "Fully-Depleted SOI", which describes a fully depleted structure produced on a silicon on insulator substrate) comprising a back control gate.

Reference in this respect can be made to the publications by Yamaoka et al. ("SRAM Circuit With Expanded Operating Margin and Reduced Stand-By Leakage Current Using Thin-BOX FD-SOI Transistors", IEEE Journal of Solid-State Circuits, Vol. 41, No 11, November 2006) and by Tsuchiya et al. ("Silicon on Thin BOX: A New Paradigm of the CMOSFET for Low-Power and High-Performance Application Featuring Wide-Range Back-Bias Control", IEEE 2004).

A conventional SRAM cell typically comprises six transistors, namely:

two access or transfer transistors: these are generally N channel field-effect transistors (NFETs), and two charge transistors and two conduction transistors, linked in pairs so as to form two back-coupled inverters: the charge transistors are, in theory, P channel FET transistors (PFETs) and the conduction transistors are NFET transistors.

In the abovementioned publications, the back control gate, which is formed under the insulator, is used to control the operating conditions of the transistors more accurately.

The back control gate is a doped region formed under each transistor, each group of transistors and the underlying gate corresponding to an N+ or P+ type island being insulated from the others by so-called "STI" ("Shallow Trench Isolation")

Thus, in an SRAM cell, the PFET transistors belong to one and the same island, while the NFET transistors are grouped in pairs (access transistors and conduction transistors respectively) in islands separated by the P region.

In practice, these two N regions are linked together at the periphery and to the other regions of the same type for the other columns. The same applies for the P region.

For N channel transistors, the region forming the back control gate is of P+ type, and is separated from the P type base substrate by a layer of N conductivity.

For the P channel transistors, the region forming the back control gate is of N+ type.

The article by Yamaoka et al. discloses a back control gate common to the two charge transistors, which are of P type, and a back control gate common to the access transistors and to the conduction transistors which are of N type.

In the article by Tsuchiya et al., the access transistors have a back control gate linked to ground and each pair formed by a charge transistor and a conduction transistor has a common back control gate.

However, in these devices, the back control gate simply comprises a well which is limited by the isolating trench.

Moreover, the choice of working in columns of wells does not favour the facilitation of the operating modes.

For example, the article by Yamaoka et al. describes N access transistors and N conduction transistors having the same back control gate such that their ratio remains constant regardless of the operating mode, thereby limiting the margin for improvement for the various functional modes.

Research is therefore focused on obviating the drawbacks of the existing devices and further reducing the dimensions of the SRAM-type memory cells, so as to conform roughly to Moore's law, while improving the performance levels of such cells.

SUMMARY OF THE INVENTION

According to the invention, there is proposed an SRAM-type memory cell comprising:

a semiconductor on insulator substrate comprising a thin film of semiconductor material separated from a base substrate by an insulating layer; six transistors, comprising two access transistors, two conduction transistors and two charge transistors arranged so as to form with the conduction transistors two back-coupled inverters, each of the transistors comprising a drain region and a source region arranged in the thin film, a channel extending between the source region and the drain region and a front gate situated above the channel, with each of the transistors having a back control gate formed in the base substrate below the channel and able to be biased to modulate the threshold voltage of the transistor. The memory cell also includes a first back gate line connecting the back control gates of the access transistors to a first potential and a second back gate line connecting the back control gates of the conduction transistors and charge transistors to a second potential. Advantageously, the first and second potentials are modulated according to the type of cell control operation.

According to other characteristics of this cell:

the access transistors and conduction transistors are NFET transistors, the charge transistors are PFET transistors; the back control gate of the access transistors is of N+ conductivity and the back control gate of the conduction transistors and charge transistors is of N+ conductivity;

the back control gate of the conduction transistors and charge transistors is arranged in the base substrate below the channel in a well of conductivity opposite to the conductivity of the back control gate; and/or the memory cell is fully depleted.

Another subject of the invention relates to a memory array comprising a plurality of memory cells as described hereinabove, in which the channel of each of the transistors has a minimal physical width but has an apparent width that can be modulated by the application of a potential to the back control gate of the transistor.

Another subject relates to a method of fabricating an SRAM-type memory cell as described above, comprising the steps of: providing the semiconductor on insulator substrate comprising a thin film of semiconductor material separated from the base substrate by an insulating layer, and forming back control gates in the base substrate by implantation.

Another subject of the invention relates to a method of controlling a memory cell as described above, characterized in that a so-called "high" positive voltage and a so-called "low" positive or zero voltage less than the high voltage is defined to bias the back control gates of the transistors, and in that, according to the type of cell control operation, a high voltage or a low voltage is dynamically applied to the back control gate of the transistors.

Other features of this control method include:

for a standby operation, the application of a low voltage to the back control gate of the access transistors and to the back control gate of the conduction transistors and charge transistors;

for a read operation, the application of a low voltage to the back control gate of the access transistors and a high voltage to the back control gate of the conduction transistors and charge transistors; and/or for a write operation, the application of a high voltage to the back control gate of the access transistors and a low voltage to the back control gate of the conduction transistors and charge transistors.

BRIEF DESCRIPTION OF THE DRAWINGS

Other features and advantages of the invention will emerge from the following detailed description, with reference to the appended drawings in which:

FIG. 6 illustrates the modalities controlling the threshold voltage of a transistor by virtue of the back control gate.

DETAILED DESCRIPTION OF THE INVENTION

Structure of the SRAM Cell

Figure 1:
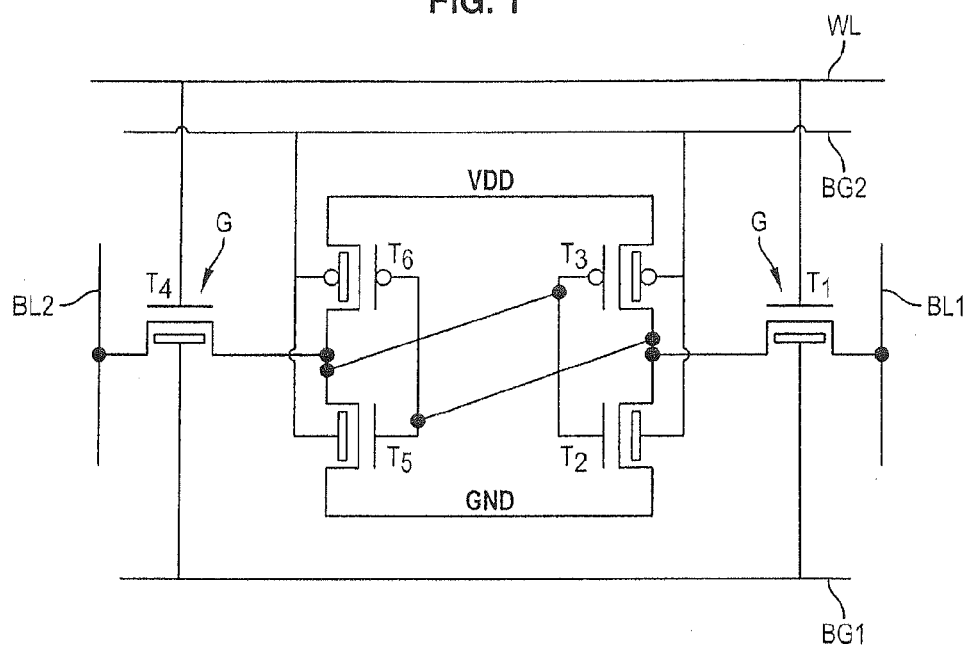
FIG. 1 is a circuit diagram of an SRAM cell according to the invention.

FIG. 1 shows the circuit diagram corresponding to an SRAM-type memory cell according to the invention.

The memory cell comprises six transistors T1 to T6.

Two of these transistors are access transistors T1 and T4.

The transistors T1 and T4 are produced on a semiconductor on insulator substrate and each of the transistors has a front gate G and a back control gate BG1 that can be controlled to modify the behaviour of the transistor.

Preferably a back gate line is used to collectively connect the back control gate BG1 of the two access transistors T1, T4 to one and the same potential, which makes it possible to provide easy and inexpensive control, but it is also possible for each of the back gates to be individually connected to a potential.

The front gate G of each of the access transistors T1 and T4 is linked to a word line WL.

Moreover, a drain electrode of each of the access transistors T1 and T4 is linked to a bit line, respectively BL1 and BL2, the bit line BL2 complementing the bit line BL1.

The memory cell further comprises two inverters, each comprising a charge transistor T3. T6 and a conduction transistor T2, T5 in series between a power supply voltage VDD and ground GND. Each inverter has an input consisting of the front gates common to the series transistors, and an output consisting of the sources common to the series transistors.

These inverters are back-coupled in a manner conventionally known per se, the input of one inverter being linked to the output of the other, and vice versa.

It will also be noted that, like the access transistors T1 and T4, the transistors T2, T3, T5 and T6 have, in addition to a front gate G, a back control gate BG2.

Preferably, a back gate line is used to collectively connect the back control gates BG2 of the transistors T2, T3, T5 and T6 to one and the same potential, which makes it possible to provide easy and inexpensive control, but it is also possible for each of the back gates to be connected separately to a potential.

Preferably, the back control gates BG1 and BG2 are independent from and not connected with the sources and drains of transistors T1-T6. The voltages applied to the control back gates BG1 and BG2 are independent from the power supply voltage VDD and ground GND, and can be of any one of a continuous range of values, for example VDD/2 or VDD/3.

The access transistors T1, T4 are used to control access to the back-coupled inverters during the memory cell's read and write operations.

The source electrode of each access transistor T1, T4 is thus connected to the output of one of the inverters and to the input of the other inverter.

Figure 2:
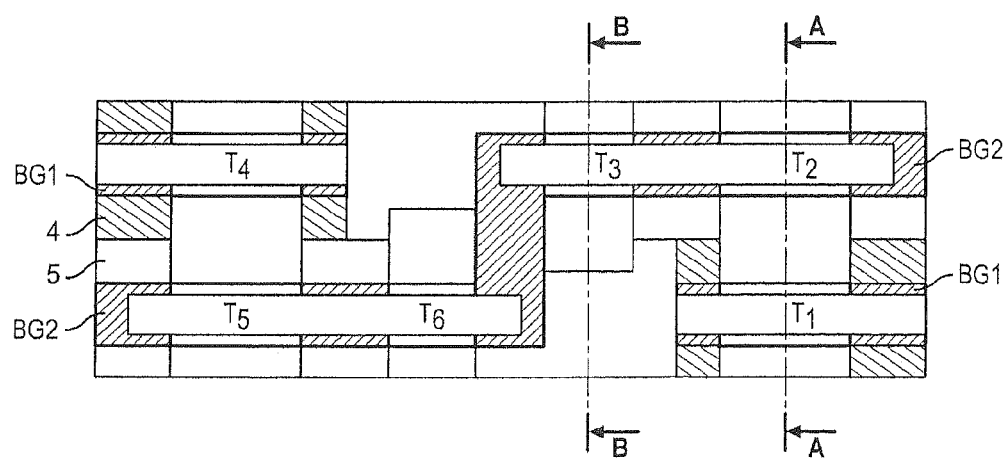
FIG. 2 illustrates the topology of the SRAM cell.

FIG. 2 illustrates the topology of the corresponding memory cell.

Figure 3:
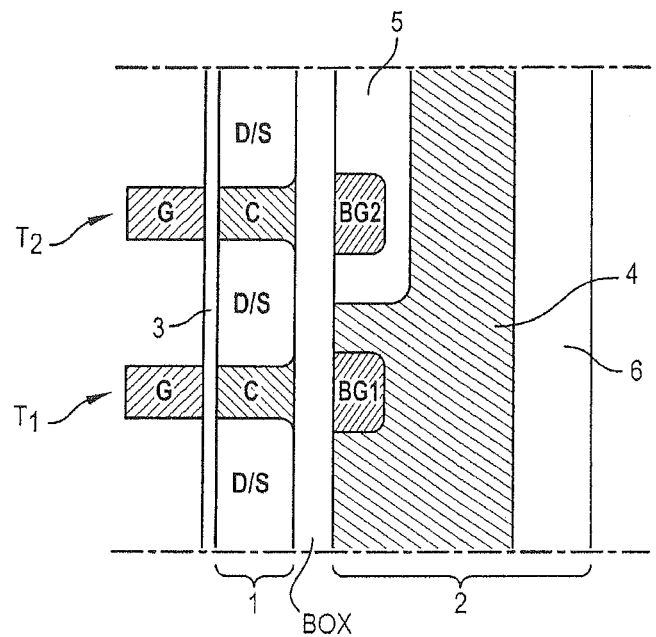
FIG. 3 is a view in cross section on A-A of the cell illustrated in FIG. 2.

FIG. 3 is a cross section on A-A of the cell illustrated in FIG. 2.

We will focus first on the access transistor T1 (the explanations given being valid for the second access transistor T4).

The semiconductor on insulator substrate comprises a thin film 1 of semiconductor material separated from a base substrate 2 by an insulating layer.

The semiconductor on insulator substrate is, for example, a silicon on insulator SOI substrate.

According to a preferred embodiment, the insulating layer is a Buried Oxide BOX layer.

The insulating layer is, for example, made of $SiO_2$.

The structure of the substrate, thin film, and insulating layer are generally known to a skilled artisan.

The transistor T1 is an NFET transistor which has a source region S, a drain region D and a floating channel C extending between the source region and the drain region.

The drain D and source S regions are preferentially in contact with the insulating BOX layer so that the transistor is fully depleted. The substrate is then qualified as "FD SOI".

It is also possible for the transistor to be partially depleted, but this technology is less advantageous because the thicknesses of the thin film of semiconductor material and of the insulating layer are greater, so that the effect of the back control gate becomes very weak (just a few %). Furthermore, in this case, the channel must be doped, which corresponds to a situation comparable to that of the bulk substrate in terms of variability.

The front gate G extends in a manner conventionally known per se on the surface of the substrate, above the channel C and is separated therefrom by a dielectric layer 3.

In the context of the invention, the back control gate BG1 of the transistor T1 is arranged in the base substrate 2 under the insulating BOX layer facing the channel C of the transistor.

As can also be seen in FIG. 3, the transistor T2 is an NFET transistor (like the transistor T5) which has a source region S, a drain region D and a floating channel C extending between the source region and the drain region.

The drain D and source S regions are preferentially in contact with the insulating BOX layer so that the transistor is fully depleted.

The front gate G extends in a manner conventionally known per se on the surface of the substrate, above the channel C, and is separated therefrom by a dielectric layer 3.

In the context of the invention, the back control gate BG2 of the transistor T2 is arranged in the base substrate 2 under the insulating BOX layer facing the channel C of the transistor.

Figure 4:
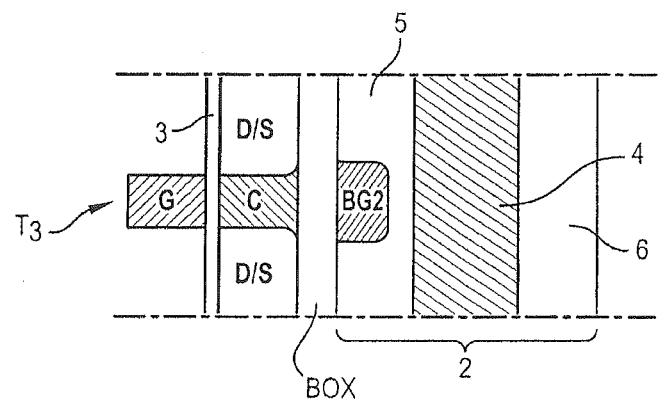
FIG. 4 is a view in cross-section on B-B of the cell illustrated in FIG. 2.

Referring to FIG. 4, the transistor T3 is a PFET transistor (like the transistor T6) which has a source region S, a drain region D and a floating channel C extending between the source region and the drain region.

The drain D and source S regions are preferentially in contact with the insulating BOX layer so that the transistor is fully depleted.

Alternatively, as explained above, the transistors T2, T3, T5 and T6 can also be partially depleted.

The front gate G extends in a manner conventionally known per se on the surface of the substrate, above the channel C, and is separated therefrom by a dielectric layer 3.

In the context of the invention, the back control gate BG2 of the transistor T3 is arranged in the base substrate 2 under the insulating BOX layer facing the channel C of the transistor.

As a purely illustrative example, the thickness of the thin film 1 of the semiconductor on insulator substrate is between 1.5 nm and 50 nm, the thickness of the insulating BOX layer is between 1.5 and 50 nm.

If the back control gate is not to have any differential working function, a conductivity of the latter will be chosen to be of the same type as that of the FET transistor (in other words, an N type conductivity for an N channel transistor, a P type conductivity for a P channel transistor).

To minimize the leakage currents in standby mode, the ideal situation would be to have a top doped region with a dopant concentration of around $10^{18}$ cm$^3$ or greater and of the opposite type to that of each of the transistors, and under all the transistors.

However, this would require the formation of three different back control gates under the memory cell, which would have the immediate effect of increasing the surface area of the cell by around 50% or more, because it would then be necessary to reconnect the back control gates individually in each cell.

Since the desired aim is to minimize the dimension of the transistors in order to minimize the surface area of the SRAM cell, the most appropriate trade-off has therefore been defined.

Thus, the access transistors T1 and T4 are NFET transistors with a back control gate BG1 of N+ type.

The conduction transistors T2 and T5 are NFET transistors with a back control gate BG2 of N+ type.

The charge transistors T3 and T6 are PFET transistors with a back control gate BG2 of N+ type.

As shown in FIGS. 3 and 4, the back control gates BG1 and BG2 are insulated from the base substrate 6 by a well denoted 4 and 5 respectively with a bias opposite to the bias of the P− substrate, the substrate 2 comprising the regions 4, 5 and 6.

The well 4 is of N− type for an N+ back control gate BG1; the well 5 is of P− type for an N+ back control gate BG2.

The voltage of the well 4, 5 is chosen so that the parasitic diode created by the electrical node between the back control gate and the well is always reversed, the diode isolating the back control gate from the well and from the back control gate BG2.

The invention also relates to a memory array comprising a plurality of SRAM cells as described above.

Figure 5:
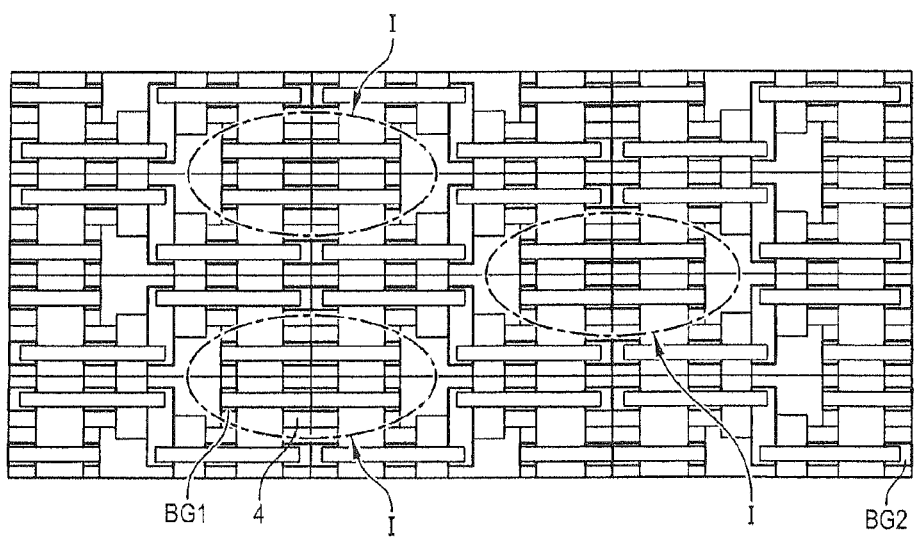
FIG. 5 illustrates the topology of an SRAM array comprising a plurality of cells according to the invention.

Such an array is illustrated in FIG. 5.

The array is organized in rows and columns.

By convention, the row is represented by the direction of the word line WL (in the case of this invention, it is also the direction of the back control gate BG2 of the transistors T2, T3, T5 and T6), which is horizontal in FIG. 5 while the column is in the direction of the bit lines (consisting of metal), which are vertical (not shown in FIG. 5).

The array comprises as many rows and columns as the application requires.

In the case of this invention, the memory cells have the particular feature of having back control gates BG1 and BG2.

The back control gate BG2 of the inverters is decoded on the one hand by the addressing (as for the word line WL) and on the other hand by the operating mode (read or write).

The back control gate BG1 "modulates" the access transistors in the islands I (see FIG. 5).

The islands I are linked together under the cell by the well 4.

The N+ conductivity of the back control gate BG1 is necessary to avoid the formation of a diode and thus allow biasing directly under the transistor.

Method of Fabricating the SRAM Cell

The SRAM cell is fabricated by the usual method of aligning masks relative to one another.

An appropriate method is described, for example, in chapter 2 of the work entitled "CMOS Digital Integrated Circuit Design: Analysis and Design" by S. M. Kang and Y. Leblebici, McGraw-Hill Publishing Co., New York, N.Y., 2003.

The levels situated under the insulating BOX layer are all formed by implantation.

Controlling the Properties of the Transistors of the SRAM Cell

In the context of the invention, the back control gates BG1 and BG2 are used dynamically: the voltage applied to them is effectively modulated according to the type of cell control operation (standby, read, write).

By biasing the back control gate of each transistor positively or negatively (typically by +/−0.3 V), the properties of the transistor can be modified individually.

In particular, the threshold voltage of the transistor can be offset.

As it happens, modifying the threshold voltage is equivalent to modifying the physical; width of the channel.

Thus, in the context of the invention, the physical width of the channel is defined once and for all and for all the transistors, but it is possible to modify, individually for each transistor, the apparent (effective) width of its channel via the control of the back control gate.

Since the voltage applied to the back control gate can be modified, the invention thus offers the advantage of a dynamic modification of the apparent width of the channel.

The variation of the threshold voltage of a transistor via the back control gate can be expressed by the formula:

$$V_{th}=V_{t0}-\alpha \cdot V_{BG},$$

in which $V_{th}$ represents the threshold voltage of the transistor, $V_{BG}$ the voltage applied to the back gate, $V_{t0}$ the nominal threshold voltage (which can be offset by the working function depending on whether an N or P type back control gate is used), and a α coefficient linked to the geometry of the transistor.

The coefficient α can in particular be modelled according to the relation:

$$\alpha = \frac{3 \cdot t_{ox1}}{t_{Si} + 3 \cdot t_{ox2}},$$

in which $t_{ox1}$ designates the thickness of the gate dielectric layer separating the front gate from the channel, $t_{ox2}$ designates the thickness of the insulating layer separating the back control gate from the channel and $t_{si}$ designates the thickness of the thin film.

It will therefore be understood that the type of doping of the back control gate of a transistor may or may not offset the nominal threshold voltage, and that the biasing of the back control gate makes it possible to adjust the threshold voltage.

It is thus possible to benefit from an increase in the conduction current $I_{ON}$ in an active state of the transistor (by reducing the threshold voltage), and a reduction of the leakage current $I_{OFF}$ in an inactive state of the transistor (by increasing the threshold voltage).

The threshold voltages can then be reduced by applying to the back control gate a voltage that is positive for an N transistor and less than VDD for a P transistor.

The invention is not, moreover, limited to the use of a zero or positive back control gate voltage, but also extends to the use of a zero or negative back control gate voltage.

The coefficient α decreases rapidly when the silicon and BOX thicknesses are too great.

For example, consider a $V_{t0}$ of 0.35 V, to which is added a working function of 0.15 V: a threshold voltage $V_{th}$ of 0.5 V is obtained.

If an operating mode requires the threshold voltage $V_{th}$ to reach 0.2 V in order to operate, α must equal 0.3 (for a power supply voltage VDD=1 V).

If the thickness ratios do not permit this, the working function must be lowered (by refining the process) so as to achieve the voltage of 0.2 V required by the operating mode.

It is obviously necessary to compensate with a negative back control gate voltage in the other modes in order to "find" the 0.5 V required by these modes.

FIG. 6 illustrates the control of the threshold voltage of a transistor produced on an SOI (or, generically, semiconductor on insulating dielectric: SeOI) substrate by the biasing of a back control gate arranged in the base substrate, under the insulating layer, facing the channel of the transistor.

In this FIG. 6, the central curve Cn represents an example of the nominal characteristic $\log(I_D(V_G))$ (transistor without back control gate).

The following values are only examples. It is clear that the values of $I_{ON}$ can vary according to the technology between 100 μA/μm et 2000 μA/μm, the current $I_{OFF}$ possibly varying between 1 fA/μm et 30 nA/μm.

The currents $I_{ON}$ and $I_{OFF}$ are respectively established at 150 μA/μm and 5 nA/μm.

The bottom curve $C_{VT-}$ represents the nominal characteristic $\log(I_D(V_G))$ under the effect of a back control gate with working function and controlled at 0 V. This bottom curve illustrates the increase in the threshold voltage. The currents $I_{ON}$ and $I_{OFF}$ are respectively established at 100 μA/μm and 200 μA/μm.

The top curve $C_{VT+}$ represents the nominal characteristic $\log(I_D(V_G))$ under the effect of a back control gate without working function and controlled with a nominal power supply voltage $V_{DD}$. This top curve illustrates the reduction in the threshold voltage. The currents $I_{ON}$ and $I_{OFF}$ are established respectively at 200 μA/μm and 100 nA/μm.

It will thus be understood that, by biasing the back control gate positively or negatively, all the space between the bottom $C_{VT-}$ and top $C_{VT+}$ curves can be covered, by thus modulating the threshold voltage of the transistor and its characteristic currents $I_{ON}$ and $I_{OFF}$.

The invention allows a reduction/increase in the apparent width of the channel that becomes all the greater as the power supply voltages become lower, which is reflected in a substantial variation in $I_{ON}$ and $I_{OFF}$.

It will be noted in this respect that the trend in the technical field of the invention is to utilize, for the future generations, electronic components with lower and lower power supply voltages. The invention is thus a priori of even more interest for the future generations.

There now follows a detailed description of the method of controlling the memory cell in the three operating modes: standby, write and read.

Standby Mode

As shown in the table below, in the standby mode, the access transistors T1 and T4 are blocked, which causes the inverters of the bit lines BL1 and BL2 to be disconnected.

The power supply voltage VDD is applied to the base substrate 2 and to the well 5 containing the back control gate BG2, while a zero voltage is applied to the well 4 containing the back control gate BG1.

A voltage that is low compared to VDD, $V_{BG1}$ is applied to the back control gate BG1 of the access transistors T1 and T4.

The threshold voltage of the transistors T1 and T4 is therefore increased, and all the more so if the BG voltage is low.

The result of this is that the conduction current $I_{ON}$ and the leakage current $I_{OFF}$ are minimized (represented by the— sign in the table below).

$V_{BG2}$ denotes the voltage applied to the back control gate BG2 of the transistors T2, T3, T5 and T6.

In the standby mode, the voltage $V_{BG2}$ is reduced.

For the NFET transistors T2 and T5, the leakage current is reduced accordingly.

For the PFET transistors T3 and T6, the leakage current may be higher; however, in an SRAM cell, PFET transistors of low conductivity and little leakage are generally used.

| | Transistor | | | | | |
|---|---|---|---|---|---|---|
| | T1 | T2 | T3 | T4 | T5 | T6 |
| | | | State | | | |
| | OFF | ON | OFF | OFF | OFF | ON |
| $V_{BG2}$ | | 0 V | 0 V | | 0 V | 0 V |
| $V_{BG1}$ | 0 V | | | 0 V | | |
| $I_{ON}$ | − | + | = | − | + | = |
| $I_{OFF}$ | − | − | = | − | − | = |

The leaks within the memory cell and originating from the bit lines are therefore minimized.

Write Mode

In the write mode, a high power supply voltage is applied to the well 4 containing the back control gate BG1; the well 5 containing the back control gate BG2 remains connected to ground GND.

A low voltage $V_{BG2}$ is maintained for the back control gate of the transistors T2, T3, T5 and T6 forming the inverters.

The NFET transistors T2 and T5 therefore remain weak, like the PFET transistors T3 and T6 which are weak by their construction.

The voltage of the well 4 is transmitted to the back control gate BG1 of the access transistors T1 and T4.

This causes the threshold voltage of the transistors to be reduced and therefore causes them to be "boosted" (higher current $I_{ON}$).

The conditions applied to the (powerful) access transistors on the one hand, and weak inverters on the other, make it possible to pass easily from the bit lines to the memory cell, and therefore to proceed with a write.

| | Transistor | | | | | |
|---|---|---|---|---|---|---|
| | T1 | T2 | T3 | T4 | T5 | T6 |
| State | | | | | | |
| | ON | ON | OFF | ON | OFF | ON |
| $V_{BG2}$ | | 0 V | 0 V | | 0 V | 0 V |
| $V_{BG1}$ | High | | | High | | |
| $I_{ON}$ | + | − | ++ | + | − | ++ |
| $I_{OFF}$ | + | − | = | + | − | = |

Read Mode

In read mode, a low power supply voltage is applied to the well 4 containing the back control gate BG1, which is transmitted to BG1. The base substrate under the well 4 is still kept connected to GND. The well 5 containing the back control gate BG2 remains grounded.

A high positive voltage $V_{BG2}$ (for example of the order of VDD) is applied to the back control gate BG2 of the transistors T2, T3, T5 and T6 forming the inverters.

The NFET transistors T2 and T5 become strong, and the apparent width of their channel is increased, while the PFET transistors T3 and T6 are weak by their construction.

Regarding the access transistors T1 and T4, the voltage $V_{BG1}$ applied to the back control gate is low.

The conditions applied to the (weak) access transistors on the one hand, and powerful inverters on the other, make it possible to protect the content of the cell from any disturbances by the BL voltages, while providing a read signal that is sufficient for detection by a peripheral amplifier.

| | Transistor | | | | | |
|---|---|---|---|---|---|---|
| | T1 | T2 | T3 | T4 | T5 | T6 |
| State | | | | | | |
| | ON | ON | OFF | ON | OFF | ON |
| $V_{BG2}$ | | High | High | | High | High |
| $V_{BG1}$ | 0 V | | | 0 V | | |
| $I_{ON}$ | − | + | = | − | + | = |
| $I_{OFF}$ | − | ++ | = | − | ++ | = |

The advantages of the invention are as follows.

The use of an FD-SOI type substrate associated with a back gate for each transistor makes it possible to modulate the apparent size of the transistors, in order to obtain secured reading, easy writing and a standby mode with leaks minimized.

Moreover, the FD-SOI substrate can be used to form non-doped channel transistors thus eliminating the variability brought about by the random distribution of the doping. This makes it possible to use transistors of minimal size without compromising the stability of the memory cell.

The present invention adapts the ratios to the operating mode and therefore improves the margins in each of the modes without compromising the correct operation of the other modes.

Also, the action is done in rows (parallel to the word line WL, all the cells activated on this WL) and therefore does not disturb the other cells of the column.

All these provisions make it possible to further reduce the dimensions of the transistors and therefore of the cell.

It goes without saying that the examples that have just been given are purely particular illustrations and do not in any way limit the fields of application of the invention.

Thus, the memory cell can also operate in a so-called "sub-threshold" mode (or "sub-threshold conduction mode") in which the power supply voltage VDD is less than the threshold voltages.

This type of cell is of particular benefit in very low power applications.

The SRAM cell according to the present invention operates with power supply voltages VDD that are lower than for the existing "sub-threshold" cells, in as much as it makes it possible to reduce the threshold voltages and the voltage VDD is lower.

The leakage currents are then reduced accordingly and more effectively than in existing cells.

What is claimed is:

1. A SRAM-type memory cell comprising:
    a semiconductor on insulator substrate comprising a thin film of semiconductor material separated from a base substrate by an insulating layer; six transistors comprising two access transistors, two conduction transistors and two charge transistors arranged so as to form with the conduction transistors two back-coupled inverters, with each of the transistors comprising a drain region and a source region arranged in the thin film, a channel extending between the source region and the drain region and a front gate situated above the channel,
    wherein each of the transistors has a back control gate formed in the base substrate below the channel and able to be biased in order to modulate the threshold voltage of the transistor, with a first back gate line connecting the back control gates of the access transistors to a first potential and a second back gate line connecting the back control gates of the conduction transistors and charge transistors to a second potential, and wherein the first and second potentials are modulated according to the type of cell control operation.

2. The memory cell according to claim 1, wherein the access transistors and conduction transistors are NFET transistors, the charge transistors are PFET transistors, and the back control gates of the access transistors are of N+ conductivity and the back control gates of the conduction transistors and charge transistors are of N+ conductivity.

3. The memory cell according to claim 1, wherein the back control gates of the conduction transistors and charge transistors are arranged in the base substrate below the channel in a well of conductivity that is opposite to that of the back control gates.

4. The memory cell according to claim 1, which is fully depleted.

5. The memory cell according to claim 1, wherein the semiconductor on insulator substrate comprises a silicon on insulator substrate and the insulating layer is a buried oxide layer.

6. A memory array comprising a plurality of SRAM cells according to claim 1, wherein the channel of each transistor has a minimal physical width but has an apparent width that can be modulated by the application of a potential to the back control gates of the transistors.

7. A method of fabricating an SRAM-type memory cell according to claim 1, which comprises:

providing a semiconductor on insulator substrate comprising a thin film of semiconductor material separated from a base substrate by an insulating layer, and forming back control gates in the base substrate by implantation of atomic species.

8. The method according to claim 1, wherein a so-called "high" positive voltage and a so-called "low" positive or zero voltage less than the high voltage is defined to bias the back control gates of the transistors, and wherein, according to the type of cell control operation, a high voltage or a low voltage is dynamically applied to the back control gates of the transistors.

9. The method according to claim 8, which further comprises, for a standby operation, applying a low voltage to the back control gates of the access transistors and to the back control gates of the conduction transistors and charge transistors.

10. The method according to claim 8, which further comprises, for a read operation, applying a low voltage to the back control gates of the access transistors and a high voltage to the back control gates of the conduction transistors and charge transistors.

11. The method according to claim 8, which further comprises, for a write operation, applying a high voltage to the back control gates of the access transistors and a low voltage to the back control gates of the conduction transistors and charge transistors.

12. The method of claim 8, wherein the semiconductor on insulator substrate comprises a silicon on insulator substrate and the insulating layer is a buried oxide layer.

\* \* \* \* \*